(12) United States Patent
Kolics et al.

(10) Patent No.: US 8,970,027 B2
(45) Date of Patent: Mar. 3, 2015

(54) METALLIZATION MIXTURES AND ELECTRONIC DEVICES

(71) Applicant: Lam Research Corporation, Fremont, CA (US)

(72) Inventors: Artur Kolics, Fremont, CA (US); Fritz Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 86 days.

(21) Appl. No.: 13/964,065

(22) Filed: Aug. 10, 2013

(65) Prior Publication Data

US 2014/0034370 A1  Feb. 6, 2014

Related U.S. Application Data

(62) Division of application No. 12/835,534, filed on Jul. 13, 2010, now Pat. No. 8,518,826.

(51) Int. Cl.
*H01L 23/04* (2006.01)
*H05K 1/09* (2006.01)
(Continued)

(52) U.S. Cl.
CPC .............. *H05K 1/09* (2013.01); *H01L 21/288* (2013.01); *H01L 21/2885* (2013.01); *H01L 21/76877* (2013.01); *H01L 21/76898* (2013.01); *H01L 23/53209* (2013.01); *H01L 23/53238* (2013.01); *H01L 23/53252* (2013.01);
(Continued)

(58) Field of Classification Search
CPC ...................... H01I 23/53209; H01I 23/53283; H01I 23/53252; H01I 23/53266
USPC ................... 257/698, 774, E23.011, E23.161
See application file for complete search history.

(56) References Cited

U.S. PATENT DOCUMENTS 4,394,712 A    7/1983   Anthony
5,266,181 A   11/1993   Matsumura et al.
(Continued)

FOREIGN PATENT DOCUMENTS

WO   2012007865 A2   1/2012
WO   2012007865 A3   1/2012

OTHER PUBLICATIONS

Electrochemical codeposition of inert particles in a metallic matrix, A. Hovestad and L.J.J: Janssen, Journal of Applied Electrochemistry, Dec. 1995, pp. 519-527.
(Continued)

*Primary Examiner* — Trung Q Dang
(74) *Attorney, Agent, or Firm* — Beyer Law Group LLP

(57) ABSTRACT

One aspect of the present invention is a method of processing a substrate. In one embodiment, the method comprises forming an electrical conductor on or in the substrate by providing a mixture comprising metal particles and an electroless deposition solution and electrolessly depositing a metal matrix and co-depositing the metal particles. In another embodiment, the method comprises forming an electrical conductor on or in the substrate by providing a mixture comprising metal particles and an electrochemical plating solution and electrochemically plating a metal matrix and co-depositing the metal particles. Another aspect of the present invention is a mixture for the formation of an electrical conductor on or in a substrate. Another aspect of the present invention is an electronic device.

11 Claims, 2 Drawing Sheets

(51) Int. Cl.
H01L 21/288 (2006.01)
H01L 21/768 (2006.01)
H01L 23/532 (2006.01)
C23C 18/18 (2006.01)
C25D 7/12 (2006.01)
C25D 3/12 (2006.01)
C25D 3/20 (2006.01)
C25D 3/22 (2006.01)
C25D 3/30 (2006.01)
C25D 3/38 (2006.01)
C25D 3/46 (2006.01)
C25D 3/48 (2006.01)
C25D 3/50 (2006.01)
C25D 3/54 (2006.01)
C25D 3/56 (2006.01)
C25D 5/02 (2006.01)
C25D 15/00 (2006.01)
C23C 18/16 (2006.01)
C23C 18/31 (2006.01)
C23C 18/40 (2006.01)
C23C 18/50 (2006.01)
C23C 18/52 (2006.01)

(52) U.S. Cl.
CPC ..... *H01L 23/53266* (2013.01); *C23C 18/1844* (2013.01); *C25D 7/123* (2013.01); *C25D 3/12* (2013.01); *C25D 3/20* (2013.01); *C25D 3/22* (2013.01); *C25D 3/30* (2013.01); *C25D 3/38* (2013.01); *C25D 3/46* (2013.01); *C25D 3/48* (2013.01); *C25D 3/50* (2013.01); *C25D 3/54* (2013.01); *C25D 3/562* (2013.01); *C25D 5/02* (2013.01); *C25D 15/00* (2013.01); *C23C 18/1607* (2013.01); *C23C 18/1662* (2013.01); *C23C 18/1834* (2013.01); *C23C 18/31* (2013.01); *C23C 18/40* (2013.01); *C23C 18/50* (2013.01); *C23C 18/52* (2013.01)
USPC ............... 257/698; 257/774; 257/E23.011; 257/E23.161

(56) References Cited

U.S. PATENT DOCUMENTS

| | | | |
|---|---|---|---|
| 6,002,177 | A | 12/1999 | Gaynes et al. |
| 6,187,678 | B1 | 2/2001 | Gaynes et al. |
| 6,273,943 | B1 | 8/2001 | Chiba et al. |
| 6,359,337 | B1 | 3/2002 | Keukelaar et al. |
| 6,630,203 | B2 | 10/2003 | Bahn et al. |
| 7,223,694 | B2 | 5/2007 | Cheng et al. |
| 7,300,860 | B2 | 11/2007 | Dubin |
| 7,528,006 | B2 | 5/2009 | Arana et al. |
| 7,591,745 | B2 | 9/2009 | Palumbo et al. |
| 7,691,189 | B2 | 4/2010 | En et al. |
| 7,959,830 | B2 | 6/2011 | Jin |
| 2004/0256236 | A1 | 12/2004 | Minevski et al. |
| 2006/0290000 | A1 | 12/2006 | Worwag et al. |
| 2007/0232059 | A1* | 10/2007 | Abe ............................ 438/625 |
| 2009/0072222 | A1 | 3/2009 | Radisic et al. |
| 2010/0075486 | A1 | 3/2010 | Vereechen |

OTHER PUBLICATIONS

Copper Electroplating to Fill Blind Vias for Three-Dimensional Integration, S. Spiesshoefer, et al., Journal of Vacuum Science Technology, A 24(4) (2006).

NASA 2009 Body of Knowledge (BoK): Through-Silicon Via Technology, David Gerke, Jet Propulsion Laboratory, Pub. 09-28, Nov. 2009.

International Preliminary Report on Patentability, International Application No. PCT/IB2011/052907, Filing Date Jul. 1, 2011.

* cited by examiner

METALLIZATION MIXTURES AND ELECTRONIC DEVICES

The present application is a divisional of U.S. patent application Ser. No. 12/835,534, titled "METALLIZATION PROCESSES, MIXTURES, AND ELECTRONIC DEVICES," to KOLICS et al., filed Jul. 13, 2010, projected issue date Aug. 27, 2013, projected U.S. Pat. No. 8,518,826. U.S. patent application Ser. No. 12/835,534 (U.S. Pat. No. 8,518,826) is incorporated herein, in its entirety, by this reference for all purposes.

BACKGROUND

This invention pertains to fabrication of electronic devices such as integrated circuits; more specifically, this invention relates to metallization and electrical interconnects for substrates used in fabricating electronic devices.

Wet chemical processes have become widely adopted for processing electronic devices that use copper metallization. Wet chemical processes such as electroless deposition (ELD) and electrochemical plating (ECP) are used for damascene and dual damascene copper fills for trenches and vias for two dimensional integrated circuits. Wet chemical processing is also used for other tasks in the fabrication of integrated circuits. Numerous established processes exist and are in use for fabricating such devices. Many of these processes have provided satisfactory results and few, if any, major improvements have been made to many of these established processes.

The present inventors have made one or more discoveries that may be pertinent to metallization interconnect technology such as that for electronic devices. The one or more discoveries may have the potential to provide one or more methods, materials, and/or electronic devices that could be replacement options for one or more current technologies.

SUMMARY

The present invention pertains to fabrication of electronic devices. One aspect of the present invention is a method of processing a substrate. In one embodiment, the method comprises forming an electrical conductor on or in the substrate by providing a mixture comprising metal particles and an electroless deposition solution and electrolessly depositing a metal matrix and co-depositing the metal particles so the metal particles are embedded in the metal matrix. In another embodiment, the method comprises forming an electrical conductor on or in the substrate by providing a mixture comprising metal particles and an electrochemical plating solution and electrochemically plating a metal matrix and co-depositing the metal particles so the metal particles are embedded in the metal matrix. Another aspect of the present invention is a mixture for the formation of an electrical conductor on or in a substrate. Another aspect of the present invention is an electronic device.

It is to be understood that the invention is not limited in its application to the details of construction and to the arrangements of the components set forth in the following description. The invention is capable of other embodiments and of being practiced and carried out in various ways. In addition, it is to be understood that the phraseology and terminology employed herein are for the purpose of description and should not be regarded as limiting.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

For the following defined terms, these definitions shall be applied, unless a different definition is given in the claims or elsewhere in this specification. All numeric values are herein defined as being modified by the term "about," whether or not explicitly indicated. The term "about" generally refers to a range of numbers that a person of ordinary skill in the art would consider equivalent to the stated value to produce substantially the same properties, function, result, etc.

A numerical range indicated by a low value and a high value is defined to include all numbers subsumed within the numerical range and all subranges subsumed within the numerical range. As an example, the range 10 to 15 includes, but is not limited to, 10, 10.1, 10.47, 11, 11.75 to 12.2, 12.5, 13 to 13.8, 14, 14.025, and 15.

The term "metal" is used herein to refer to a metal element in the periodic table of the elements and/or to metal alloys comprising one or more metal elements mixed with at least one other element; the metal and the metal alloys have the general properties of metal elements from the periodic table of the elements such as high electrical conductivity.

The term "matrix" is used herein to refer to a material that embeds or can serve to embed particles such as grains and such as powders.

The present invention pertains to fabrication of electronic devices such as integrated circuits; more specifically, this invention relates to metallization and electrical interconnects for substrates used in fabricating electronic devices. One or more embodiments of the present invention will be discussed below primarily in the context of processing semiconductor wafers such as silicon wafers used for fabricating integrated circuits. The metallization layers may include metal lines formed into damascene and/or dual damascene dielectric structures. One or more embodiments are also presented related to through-substrate metallization interconnects such as those used for three-dimensional integrated circuits. However, it is to be understood that embodiments in accordance with the present invention may be used for or with other semiconductor devices, metals other than copper, and wafers other than semiconductor wafers.

Figure 1:
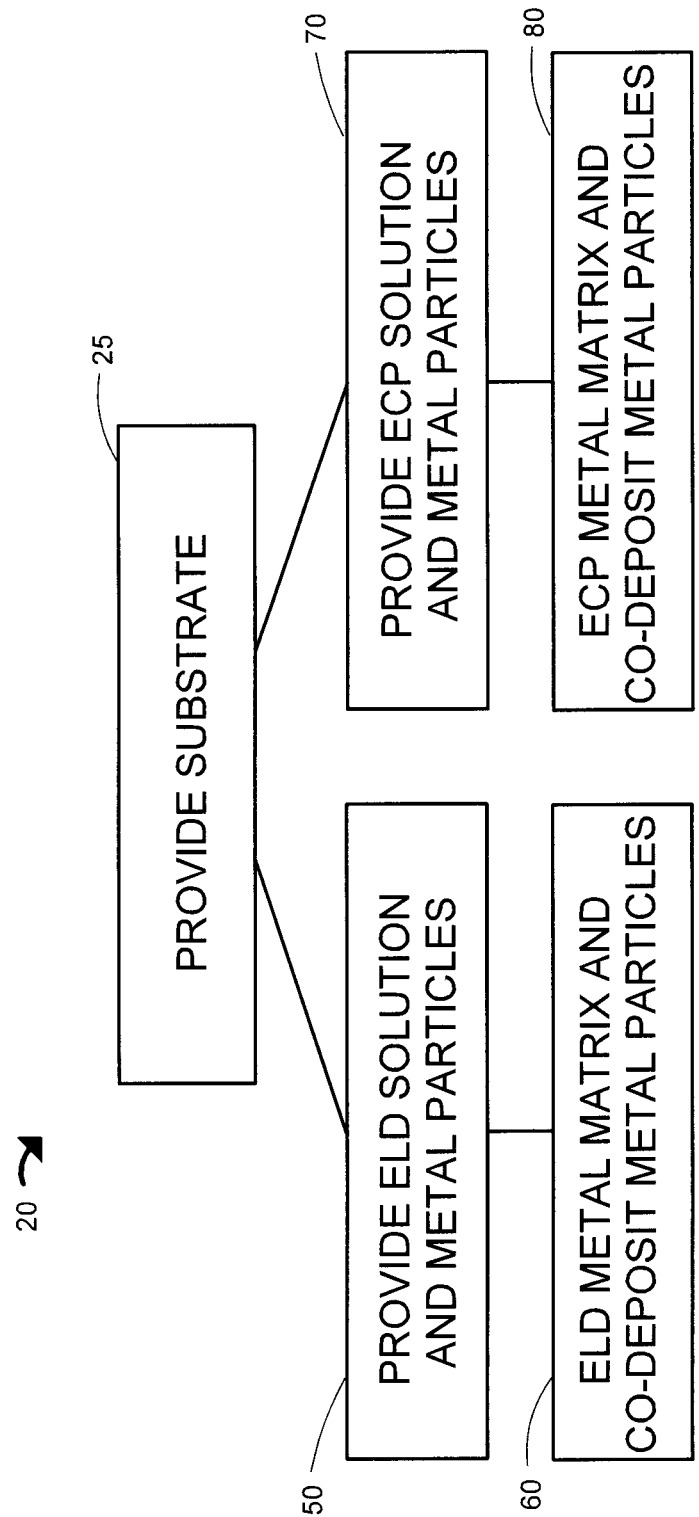
FIG. 1 is a process flow diagram of an embodiment of the present invention.

Reference is now made to FIG. 1 where there is shown an exemplary process diagram 20 according to one or more embodiments of the present invention. Exemplary process diagram 20 comprises a non-exhaustive series of steps to which additional steps (not shown) may also be added. One of ordinary skill in the art would recognize many variations, modifications, and alternatives. FIG. 1 shows exemplary process diagram 20 includes providing a substrate 25. Optionally, the substrate may be a substrate such as a semiconductor wafer such as a silicon wafer or a substrate of another material suitable for fabricating electronic devices.

Process flow diagram 20 also involves forming an electrical conductor on or in the substrate. More specifically, the electrical conductor may be formed on the surface of the substrate such as the formation of a layer of the electrical conductor over all or at least over a portion of the surface of the substrate and/or the electrical conductor is formed over or in features fabricated in the substrate such as trenches, such as blind vias, such as through-hole vias, and/or other substrate features for technologies such as damascene metallization, such as dual-damascene metallization, and such as through-substrate via metallization. As an option, the electrical conductor may be formed as a layer and/or the electrical conductor may be formed as a gapfill such as for trench fill and/or such as for via fill.

For one or more embodiments of the present invention, process flow diagram 20 comprises providing an electroless deposition (ELD) solution and metal particles 50. Optionally, the electroless deposition solution and the metal particles may be pre-mixed prior to performing the process. Alternatively, the electroless deposition solution and the metal particles may be provided separately so that they may be mixed substantially just before the process is performed. As another option, the process may be performed with the metal particles and the electroless deposition solution being mixed continuously such as in a substantially continuous flow process. Next is electroless deposition of a metal matrix and co-deposition of the metal particles 60. In other words, the electroless deposition solution is used to electrolessly deposit metal from ions dissolved in the solution to form a metal matrix. The metal particles co-deposit so that the metal particles are embedded in the metal matrix.

According to one or more embodiments of the present invention, the electroless deposition is accomplished using an electroless deposition solution such as an aqueous solution comprising one or more metal salts and one or more reducing agents. Optionally, the electroless deposition solution may further comprise one or more complexing agents, one or more pH adjustors, one or more buffering agents, one or more surfactants, and one or more additives. The composition of the electroless deposition solution is selected so as to produce a metal matrix having one or more desired properties and/or to provide additional process control and stability. Electroless deposition processes used for one or more embodiments of the present invention involve oxidation-reduction reactions that are chemically driven without the need for application of an external electrical current.

The use of electroless deposition is an option for one or more embodiments of the present invention. For one or more other embodiments of the present invention, process flow diagram 20 comprises providing an electrochemical plating (ECP) solution and metal particles 70. Optionally, the electrochemical plating solution and the metal particles may be pre-mixed prior to performing the process. Alternatively, the electrochemical plating solution and the metal particles may be provided separately so that they may be mixed substantially just before the process is performed. As another option, the process may be performed with the metal particles and the electroless deposition solution being mixed continuously such as in a substantially continuous flow process. Next is electrochemical plating of a metal matrix and co-deposition of the metal particles 80. In other words, the electrochemical plating solution is used to electrochemically plate metal from ions from the electrochemical plating solution to form a metal matrix. The metal particles co-deposit so that the metal particles are embedded in the metal matrix.

According to one or more embodiments of the present invention, the electrochemical plating is accomplished using an electrochemical plating solution such as an aqueous solution comprising an electrolyte and, optionally, one or more metal salts. Optionally, the electrochemical plating solution may further comprise one or more complexing agents, one or more pH adjustors, one or more buffering agents, one or more surfactants, and one or more additives. The composition of the electrochemical plating solution is selected so as to produce a metal matrix having one or more desired properties, and/or to provide additional process control and stability. Electrochemical plating processes for one or more embodiments of the present invention involve oxidation-reduction reactions that are driven by the application of an external electrical current and the substrate serves as a cathode. For applications in which the substrate is not sufficiently electrically conductive to work as an electrode, an electrically conductive seed layer is deposited on the substrate prior to the electrochemical plating.

Embodiments of the present invention according to process flow diagram 20 may include numerous variations. Many of the possible variations may apply to embodiments of the present invention that use electroless deposition to produce a metal matrix and to embodiments of the present invention that use electrochemical plating to produce the metal matrix. The following are exemplary variations in process flow diagram 20 that are applicable for use with electroless deposition and/or are applicable for use with electrochemical plating of the metal matrix.

According to one or more embodiments of the present invention, the providing the electroless deposition solution and metal particles 50 and the providing the electrochemical plating solution and metal particles 70 may comprise providing metal particles having substantially the same composition as the metal matrix. In other words, there is the option for one or more embodiments of the present invention in which the composition of the metal matrix is the same composition used for the metal particles so that the electrically conductive layer resulting from the metal matrix and embedded metal particles is substantially uniform in composition. Generally, the metal matrix may be any pure metal element of the periodic table or an alloy thereof suitable for electronic device metallization. Similarly, the metal particles may be any pure metal element of the periodic table or an alloy thereof suitable for electronic device metallization. A particular example for such an embodiment could be an embodiment that deposits substantially pure copper as the metal matrix and that embeds particles of substantially pure copper. Another particular example could be one in which a copper alloy is the metal matrix and the embedded particles are a copper alloy having the same composition as that of the metal matrix.

According to one or more embodiments of the present invention, the providing the electroless deposition solution and metal particles 50 and the providing the electrochemical plating solution and metal particles 70 may comprise providing metal particles having a composition dissimilar to the composition of the metal matrix. In other words, there is the option, for one or more embodiments of the present invention in which the composition of the metal matrix is different from the composition used for the metal particles so that the composition of the electrically conductive layer resulting from the metal matrix and embedded metal particles is not uniform. A particular example for such an embodiment could be an embodiment that deposits substantially pure copper as the metal matrix and that embeds particles of a copper alloy. Or vice versa, the metal matrix may be a copper alloy and the embedded particles may be substantially pure copper. Another particular example could be one in which a copper alloy is the metal matrix and the embedded particles are another copper alloy having a different composition from that of the metal matrix.

Other embodiments of the present invention may include other combinations of compositions for the metal matrix and compositions for the metal particles. According to one or more embodiments of the present invention, the providing the electroless deposition solution and metal particles 50 and the providing the electrochemical plating solution and metal particles 70 may comprise providing electroless deposition solution or electrochemical plating solution to produce a metal matrix composition such as, but not limited to, cobalt, cobalt alloy, cobalt tungsten alloy, cobalt tungsten phosphorous alloy, nickel, nickel alloy, substantially any metal that can be electrolessly deposited or electrochemically plated under conditions suitable for the fabrication of electronic devices, and substantially any metal comprising at least one of the elements cobalt, copper, gold, iridium, iron, molybdenum, nickel, osmium, palladium, platinum, rhenium, rhodium, ruthenium, silver, tin, tungsten, and zinc. According to one or more embodiments of the present invention, the providing the electroless deposition solution and metal particles 50 and the providing the electrochemical plating solution and metal particles 70 may comprise providing metal particles comprising at least one of the elements cobalt, copper, gold, iridium, iron, molybdenum, nickel, osmium, palladium, platinum, rhenium, rhodium, ruthenium, silver, tin, tungsten, and zinc. In general, the metal particles may be substantially any metal that is substantially insoluble in the electroless deposition solution and/or the electrochemical plating solution under conditions suitable for the fabrication of electronic devices.

According to one or more embodiments of the present invention, process flow diagram 20 includes variations to produce differences between the metal matrix and the metal particles other than differences in composition and/or in addition to differences in composition. According to one or more embodiments of the present invention, the providing the electroless deposition solution and metal particles 50 and the providing the electrochemical plating solution and metal particles 70 may comprise providing metal particles having substantially the same crystalline structure and/or crystalline microstructure as the metal matrix. In other words, there is the option, for one or more embodiments of the present invention, in which the crystalline properties such as crystalline structure and/or such as crystalline grain size of the metal matrix is the same as that used for the metal particles so that the electrically conductive layer resulting from the metal matrix and embedded particles is substantially uniform in crystalline structure. A particular example for such an embodiment could be an embodiment that deposits substantially pure copper as the metal matrix and has the same crystalline structure and crystalline grain size as the embedded particles of substantially pure copper.

Alternatively, there is the option, for one or more embodiments of the present invention, in which crystalline properties such as crystalline structure and/or such as crystalline grain size of the metal matrix is not the same as that for the metal particles. Another particular example could be one in which a copper metal matrix having a range of crystalline grain sizes or other crystalline properties that differs from the range of crystalline grain sizes or other crystalline properties of the embedded copper metal particles.

Methods according to one or more embodiments of the present invention may use a variety of sizes for the metal particles embedded in the metal matrix. Optionally, the metal particles may have a consistent size and/or a narrow size range. Alternatively, a range of particle sizes may be intentionally used for the metal particles. In one embodiment of the present invention, the method includes providing metal particles having a maximum diameter of less than 30 micrometers. According to another embodiment of the present invention, the method includes providing metal particles having a maximum size in the range from 0.1 micrometer to 10 micrometers. According to more detailed embodiments of the present invention, the method includes providing metal particles comprising at least one of the elements cobalt, copper, gold, iridium, iron, molybdenum, nickel, osmium, palladium, platinum, rhenium, rhodium, ruthenium, silver, tin, tungsten, and zinc and the particles have a maximum size of less than 30 micrometers.

As indicated above, one or more embodiments of the present invention may be used to form an electrical conductor on or in a substrate such as a substrate that includes one or more vias such as may be used for forming through-substrate electrical conductors for three-dimensional integrated circuits. One embodiment of the present invention comprises providing a substrate having one or more vias and forming an electrical conductor on or in the substrate by loading the one or more vias with a mixture comprising metal particles and an electroless deposition solution and electrolessly depositing a metal matrix and co-depositing the metal particles in the one or more vias; or loading the one or more vias with a mixture comprising metal particles and an electrochemical plating solution, and electrochemically plating a metal matrix and co-depositing the metal particles in the one or more vias. Optionally, vias processed using one or more embodiments of the present invention may be blind vias for which the bottom of the vias is closed, a through-substrate via in which the bottom of the via is open, or blind vias that are filled according to embodiments of the present invention and then opened at the bottom using additional process steps.

As another option, one or more methods according to embodiments of the present invention comprise forming a barrier layer coating on a surface and/or the sidewalls of a via. Barrier metal particles are co-deposited along with an electrolessly deposited barrier metal matrix or electrochemically plated barrier metal matrix. The method is accomplished using a mixture of barrier metal particles and an electroless deposition solution for electrolessly depositing a barrier metal matrix or a mixture of barrier metal particles and an electrochemical plating solution for electrochemically plating a barrier metal matrix.

One or more embodiments of the present invention are mixtures of metal particles and an electroless deposition solution such as an aqueous solution comprising one or more metal salts and one or more reducing agents. Optionally, the electroless deposition solution may further comprise one or more complexing agents, one or more pH adjustors, one or more buffering agents, one or more surfactants, and/or one or more additives. The one or more metal salts provide dissolved metal ions. The composition of the electroless deposition solution is selected so as to produce a metal matrix deposited from the metal ions. The metal salts may comprise ions to deposit a metal matrix composition such as, but not limited to, cobalt, cobalt alloy, cobalt tungsten alloy, cobalt tungsten phosphorous alloy, nickel, nickel alloy, substantially any metal that can be electrolessly deposited under conditions suitable for the fabrication of electronic devices, and substantially any metal comprising at least one of the elements cobalt, copper, gold, iridium, iron, molybdenum, nickel, osmium, palladium, platinum, rhenium, rhodium, ruthenium, silver, tin, tungsten, and zinc. According to a more specific embodiment, the mixture comprises copper particles and an electroless deposition solution comprising copper ions for electroless deposition of copper or copper alloy. The copper ions may be produced by dissolving one or more copper salts in an aqueous solution.

One or more other embodiments of the present invention are mixtures of metal particles and an electrochemical plating solution such as an aqueous solution comprising an electrolyte and, optionally, one or more metal salts. The metal salts may comprise ions to deposit a metal matrix composition such as, but not limited to, cobalt, cobalt alloy, cobalt tungsten alloy, cobalt tungsten phosphorous alloy, nickel, nickel alloy, substantially any metal that can be electrochemically plated under conditions suitable for the fabrication of electronic devices, and substantially any metal comprising at least one of the elements cobalt, copper, gold, iridium, iron, molybdenum, nickel, osmium, palladium, platinum, rhenium, rhodium, ruthenium, silver, tin, tungsten, and zinc. Optionally, the electrochemical plating solution may further comprise one or more complexing agents, one or more pH adjustors, one or more buffering agents, one or more surfactants, and/or one or more additives. According to a more specific embodiment, the mixture comprises copper particles and an electrochemical plating solution containing copper ions for electrochemical plating of copper or copper alloy. Optionally the source of the copper ions may be dissolved copper salts or the copper ions may be from an anode used for the electrochemical plating process.

Mixtures according to one or more embodiments of the present invention may include metal particles of a variety of sizes. Optionally, the metal particles may have a consistent size or a narrow size range. Alternatively, a mixture of particle sizes may be intentionally used for the metal particles. In one embodiment of the present invention, the metal particles have a maximum size of less than 30 micrometers. According to another embodiment of the present invention, the metal particles have a maximum size in the range from 0.1 micrometer to 10 micrometers.

Mixtures according to one or more embodiments of the present invention comprise an electroless deposition solution that has a chemical composition to produce an electrolessly deposited metal matrix that has a chemical composition different from the chemical composition of the metal particles. In other words the electroless deposition solution composition produces a metal matrix having a composition that is different from the composition of the metal particles. According to a more specific embodiment, the electroless deposition solution has a composition to produce a matrix comprising copper that has a chemical composition that is different from the chemical composition of the metal particles. In still another embodiment, the mixture comprises an electroless deposition solution having a composition to deposit a matrix comprising copper and the mixture includes copper particles; the composition of the matrix comprising copper and the composition of the copper particles are different.

Alternatively, mixtures according to one or more embodiments of the present invention comprise an electroless deposition solution that has a chemical composition to produce an electrolessly deposited metal matrix that has a chemical composition substantially the same as the chemical composition of the metal particles included in the mixture.

In still another embodiment, the mixture comprises an electroless deposition solution having a composition to deposit a matrix comprising copper and the mixture includes copper or copper alloy particles; the composition of the matrix comprising copper and the composition of the copper or copper alloy particles are substantially the same.

Mixtures according to one or more embodiments of the present invention comprise an electrochemical plating solution and metal particles wherein the composition of the metal particles is substantially the same as the composition of a metal matrix plated from the electrochemical plating solution. According to a more specific embodiment, the electrochemical plating solution may have a composition for the deposition of a matrix comprising copper and the metal particles may comprise copper having a composition that is substantially the same as the composition of the metal matrix.

Mixtures according to one or more embodiments of the present invention comprise an electrochemical plating solution and metal particles wherein the composition of the metal particles is different from the composition of a metal matrix plated from the electrochemical plating solution. According to a more specific embodiment, the electrochemical plating solution may have a composition for the deposition of a matrix comprising copper and the metal particles may comprise copper and have a composition that is different from the composition of the matrix comprising copper.

Mixtures according to one or more embodiments of the present invention comprise metal particles and an electroless deposition solution for the deposition of a metal matrix. Optionally, the metal particles may comprise elements such as, but not limited to, copper, silver, and gold. As one option, the electroless deposition solution may have a composition to electrolessly deposit a metal matrix comprising copper. As another option, the mixture comprises copper particles and an electroless deposition solution that has a composition for electroless deposition of a copper metal matrix. More generally, the metal particles may comprise at least one of the elements cobalt, copper, gold, iridium, iron, molybdenum, nickel, osmium, palladium, platinum, rhenium, rhodium, ruthenium, silver, tin, tungsten, and zinc. The metal particles may be substantially any metal that is substantially insoluble in the electroless deposition solution and/or the electrochemical plating solution under conditions suitable for the fabrication of electronic devices.

One or more embodiments of the present invention pertain to a method of fabricating a semiconductor device such as a three dimensional integrated circuit that comprises through-substrate electrical conductors. The semiconductor device comprises a semiconductor material that may be present as a semiconductor wafer, a semiconductor chip, a semiconductor layer, or combinations thereof. The semiconductor material may be supported on a substrate of another material such as glass, quartz, sapphire, aluminum oxide, ceramic, or chip carrier material. The semiconductor device may include devices such as electronic devices, transistors, optical devices, and/or memory devices. The semiconductor material may be group IV element semiconductors, group III-V element semiconductors, and/or other semiconductors.

A three-dimensional integrated circuit may include two or more semiconductor chips with integrated circuits or includes two or more semiconductor wafers with integrated circuits. The semiconductor chips or semiconductor wafers are stacked together, bonded, and electrically interconnected in three dimensions, i.e., integrated within the semiconductor chips or semiconductor wafers and integrated between the semiconductor chips or semiconductor wafers. The interconnections between the chips or between the wafers are accomplished by way of through holes from the back side to the front side of one or more of the chips or one or more of the semiconductor wafers. In other words, the electrical connections between the stack of chips or stack of wafers are made by way of the through holes. Three-dimensional integrated circuits may have a large number of through holes for interconnect metallization between the semiconductor chips or between the semiconductor wafers.

Three-dimensional integrated circuits, according to some designs, will use through-substrate vias that are large, high aspect ratio features with dimensions an order of magnitude or more larger than the minimum geometry features for standard technology dual damascene metallization interconnects.

The through-substrate vias may require diameters of about 5-30 micrometers. The length for some contact holes may be 70 to 300 micrometers.

One or more embodiments of the present invention may be used to form electrical conductors at much higher deposition rates than may be achieved by some other processes. One or more embodiments of the present invention may yield deposition rates that are 10 times higher than those obtainable using alternative technologies. Also, one or more embodiments of the present invention may provide electric conductors having higher electrical conductivity than can be obtained using standard device fabrication technology. One or more embodiments of the present invention may provide a wider variety of materials for fabrication and metallization for integrated circuits, both two-dimensional integrated circuits and three-dimensional integrated circuits.

Figure 2:
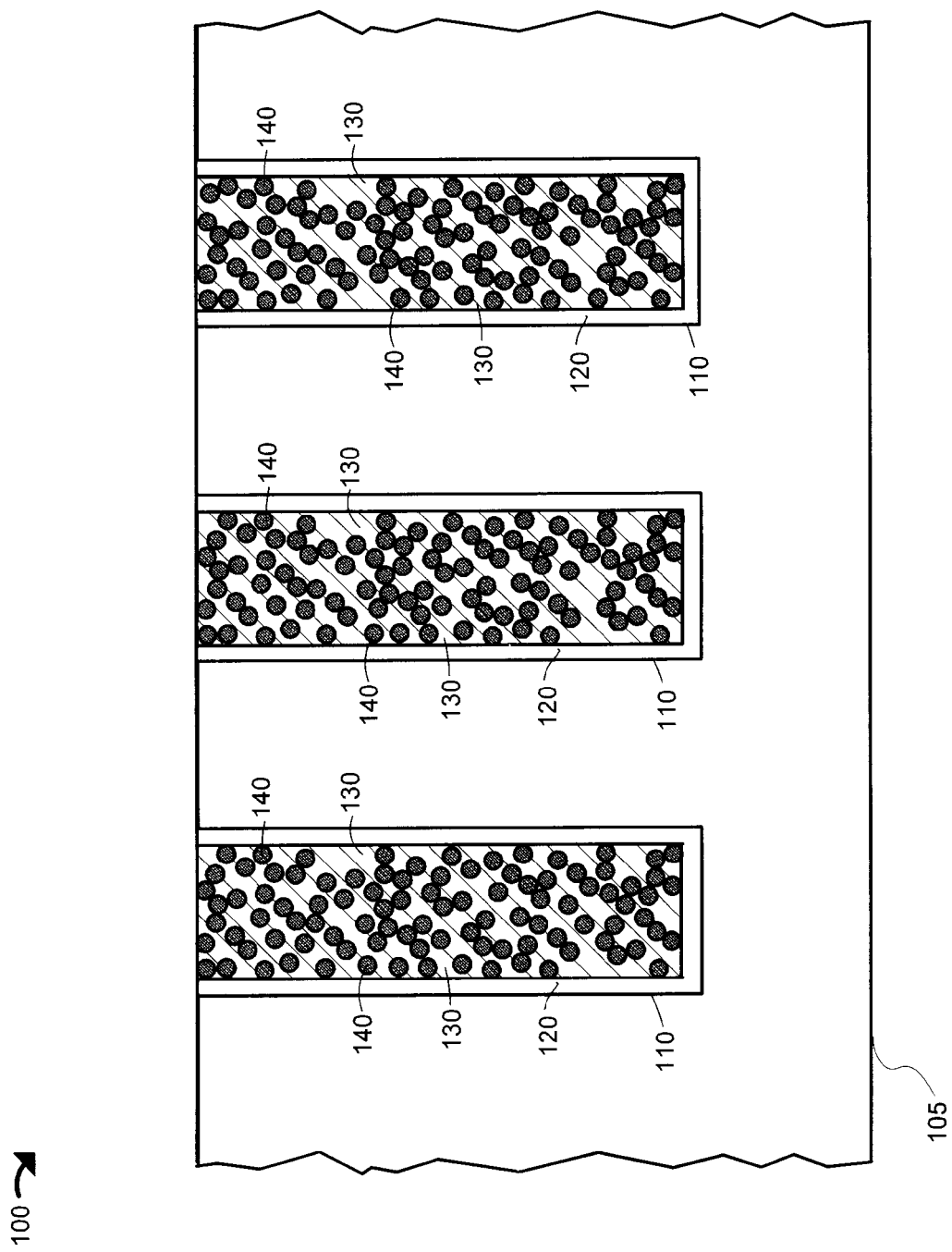
FIG. 2 is a diagram of a cross-section side view of a portion of a substrate according to an embodiment of the present invention.

Reference is now made to FIG. 2 where there is shown a cross-section side view of a portion of an electronic device 100 according to one or more embodiments of the present invention. Electronic device 100 includes a substrate 105. Substrate 105 may be a substrate such as a semiconductor wafer such as a silicon wafer or a substrate of another material suitable for fabricating electronic devices. FIG. 2 shows electronic device 100 having vias 110 in the form of holes in substrate 105. Electronic device 100 further includes a barrier layer and/or seed layer 120 lining the surfaces of vias 110. FIG. 2 further shows vias 110 filled with a metal matrix 130, form by electroless deposition or formed by electrochemical plating, and metal particles 140. Metal particles 140 are embedded in metal matrix 130 as a co-deposit with the electrolessly deposited metal matrix or the electrochemically plated metal matrix.

Embodiments of the present invention may use a variety of materials for barrier layer and/or seed layer 120. Typical materials used for barrier layers are materials that substantially prevent diffusion of metals into substrate 105. Examples of some materials for barrier layers include, but are not limited to, tantalum, tantalum/tantalum nitride, nickel, and nickel alloys. As an option for one or more embodiments of the present invention, the barrier layer comprises barrier metal particles embedded in a barrier metal matrix.

A variety of materials may be selected for use as metal matrix 130 according to one or more embodiments of the present invention. Examples of materials that may be used as metal matrix 130 include, but are not limited to, copper, copper alloy, cobalt, cobalt alloy, cobalt tungsten alloy, cobalt tungsten phosphorous alloy, nickel, nickel alloy, substantially any metal that can be electrolessly deposited or electrochemically plated under conditions suitable for the fabrication of electronic devices, and substantially any metal comprising a least one of the elements cobalt, copper, gold, iridium, iron, molybdenum, nickel, osmium, palladium, platinum, rhenium, rhodium, ruthenium, silver, tin, tungsten, and zinc.

According to one or more embodiments of the present invention, a variety of materials may be selected for use as metal particles 140. Examples of materials that may be used for metal particles 140 include, but are not limited to, metal particles comprising a least one of the elements cobalt, copper, gold, iridium, iron, molybdenum, nickel, osmium, palladium, platinum, rhenium, rhodium, ruthenium, silver, tin, tungsten, and zinc. Generally, metal particles 140 may be substantially any metal that is substantially insoluble in the electroless deposition solution and/or the electrochemical plating solution used to fabricate metal matrix 130.

According to one embodiment of the present invention, metal matrix 130 comprises copper and metal particles 140 comprise copper. In another embodiment, metal particles 140 are copper particles and metal matrix 130 is copper. Optionally, the composition of metal matrix 130 is substantially the same as the composition of metal particles 140. In another embodiment of the present invention, metal matrix 130 has a crystalline structure and/or crystalline morphology that is different from the crystalline structure and/or crystalline morphology of metal particles 140. According to one or more embodiments of the present invention, metal particles 140 are selected to have a maximum size less than about 30 micrometers. According to another embodiment of the present invention, metal particles 140 are selected to have a maximum size in the range from about 0.1 micrometer to about 10 micrometers.

In the foregoing specification, the invention has been described with reference to specific embodiments. However, one of ordinary skill in the art appreciates that various modifications and changes can be made without departing from the scope of the present invention as set forth in the claims below. Accordingly, the specification is to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

What is claimed is:

1. An electronic device comprising:
   a substrate having one or more through-substrate vias;
   a barrier layer on the walls of the one or more substrate vias;
   a matrix comprising copper, wherein the matrix comprising copper is copper; and
   metal particles embedded in the matrix, wherein the metal particles comprise copper;
   wherein the metal particles and the matrix comprising copper substantially fill the one or more vias.

2. The electronic device of claim 1, wherein the metal particles are copper.

3. The electronic device of claim 1, wherein the metal particles comprise silver or gold.

4. The electronic device of claim 1, wherein the barrier layer comprises barrier metal particles embedded in a barrier metal matrix.

5. The electronic device of claim 1, wherein the substrate is a silicon chip.

6. The electronic device of claim 1, wherein the metal particles size are in the range from 0.1 micrometer to 10 micrometer.

7. An electronic device comprising:
   a substrate having one or more through-substrate vias;

a barrier layer on the walls of the one or more substrate vias;
a matrix comprising a metal; and
metal particles greater than 0.2 micrometers in size embedded in the matrix, wherein the metal particles and the matrix have substantially the same composition;
wherein the metal particles and the matrix substantially fill the one or more vias.

8. The electronic device of claim 7, wherein the matrix comprises copper and the metal particles comprise copper.

9. The electronic device of claim 7, wherein the matrix comprises at least one of the elements cobalt, iridium, iron, molybdenum, nickel, osmium, palladium, platinum, rhenium, rhodium, ruthenium, tin, and zinc.

10. The electronic device of claim 7, wherein the metal particles comprise a least one of the elements selected from the group consisting of cobalt, iridium, iron, molybdenum, nickel, osmium, palladium, platinum, rhenium, rhodium, ruthenium, tin, and zinc.

11. The electronic device of claim 7, wherein the matrix and the metal particles embedded therein are formed in the one or more vias by electroless deposition or electrochemical plating.

* * * * *